United States Patent [19]

Koyama

[11] Patent Number: 5,780,310
[45] Date of Patent: Jul. 14, 1998

[54] METHOD OF FABRICATING A MEMORY CELL ARRAY AREA AND A PERIPHERAL CIRCUIT AREA

[75] Inventor: Kuniaki Koyama, Tokyo, Japan

[73] Assignee: NEC Corporation, Tokyo, Japan

[21] Appl. No.: 476,233

[22] Filed: Jun. 7, 1995

Related U.S. Application Data

[62] Division of Ser. No. 288,355, Aug. 10, 1994, Pat. No. 5,451,269, which is a division of Ser. No. 993,382, Dec. 18, 1992, Pat. No. 5,348,904.

[30] Foreign Application Priority Data

Dec. 20, 1991 [JP] Japan ............................ 3-356070

[51] Int. Cl.⁶ .................................... H01L 21/8239
[52] U.S. Cl. ............................... 437/52; 437/48
[58] Field of Search ........................... 437/48, 52, 984

[56] References Cited

U.S. PATENT DOCUMENTS 4,554,729  11/1985  Tamimura et al. .................. 437/52
4,882,289  11/1989  Moriuchi et al. ................... 437/52

Primary Examiner—Chandra Chaudhari

[57] ABSTRACT

The invention provides a semiconductor substrate structure for semiconductor integrated circuit devices including a memory cell array area involving both stacked capacitors and transistors and a peripheral circuit area involving transistors. A portion of the device in the memory cell area has a larger thickness than that of the peripheral circuit area. The transistors involved in the memory cell array area possess different properties from that of the transistors involved in the peripheral circuit area. The substrate structure has a surface region comprising a first impurity concentration region underlying a recessed portion in the memory cell array area and an opposite region having a second impurity concentration from that of the high impurity concentration region so that a surface in the memory cell area exists at a lower level than that of a surface in the peripheral area. The recessed portion makes difference in surface levels of the device reduced, resulting in fine patterns of photolithography promoting high integration. Both the first and second impurity concentrations are so determined as to allow the transistors involved in the both areas to exhibit best performances and an excellent properties respectively.

1 Claim, 12 Drawing Sheets

METHOD OF FABRICATING A MEMORY CELL ARRAY AREA AND A PERIPHERAL CIRCUIT AREA

This application is a division of prior application Ser. No. 08/288,355 now U.S. Pat. No. 5,451,269, filed Aug. 10, 1994, which was a division of Ser. No. 07/993,382, now U.S. Pat. No. 5,348,906 filed Feb. 18, 1992.

BACKGROUND OF THE INVENTION

The invention relates to a semiconductor memory device including an improved substrate structure and a method of fabricating the same.

The semiconductor memory device including a memory cell array area and a peripheral circuit area is formed on a surface of a semiconductor substrate such as silicon substrate. High integration and excellent device performance, especially excellent transistor characteristics are most important to such memory cell devices. The realization of the high integration and excellent device performance such as excellent transistor characteristics will now be considered.

The accomplishment of the high integration of the memory device depends upon a photo-lithography technology for delineating fine patterns. The implementation of the fine pattern, and thus the fine etching pattern further depends upon not only a resolution of photo resist patterns but the irregularity possessed by a surface of the memory device.

The excellent transistor characteristics depends upon the impurity concentration of the surface region in the semiconductor substrate.

For consideration of the above matters, dynamic random access memory cells (DRAM cells) involving stacked capacitor cells will be taken up as a typical semiconductor memory device. FIG. 1 illustrates a conventional structure of the DRAM cells comprising the peripheral circuit area and the memory cell array area involving the stacked capacitors. The structure of the conventional DRAM cells has a p-type silicon substrate 1. The p-type silicon substrate 1 having a flat surface comprises a memory cell array area 110 and a peripheral circuit area 113.

A p$^+$-type well region which is not illustrated is formed in the memory cell array area 110 of the p-type silicon substrate 1. Gate oxide films 11 are formed in the surface of the memory cell array area 110 and the peripheral circuit area 113 of the p-type silicon substrate 1. A field oxide film 10 is formed in the surface of the p-type silicon substrate 1 so as to separate the memory cell array area 110 from the peripheral circuit area 113. Both the field oxide film 10 and the gate oxide film 11 are formed by using a selective oxidation such as local oxidation of silicon (LOCOS). Gate electrodes 12 are formed on the gate oxide film 11 in both the memory cell array area 110 and the peripheral circuit area 113. An ion-implantation of an opposite conductive type impurity to that of the silicon substrate 1, or the donor is carried out by using the self-alignment technique so that source and drain diffusion regions 111 and 112 are formed in the memory cell array area 110 and the peripheral circuit area 113, thereby resulting in a self-aligned gate structure. The result is that field effect transistors are formed in both the memory cell array area 110 and the peripheral circuit area 113. A silicon oxide film 14 is formed by using a chemical vapor deposition so as to cover an entire surface of the device, and thus to cover the gate electrodes 12. The silicon oxide film 14 serves as an inter-layer insulator. A bottom electrode 15 of a stacked capacitor is formed in the memory cell array area 110 so as to be electrically connected to the source region 112 of the transistor. A capacitive insulation film is so formed as to cover the bottom electrode 15 of the stacked capacitor. A top electrode 17 of the stacked capacitor is formed on the capacitive insulation film 16 and on the silicon oxide film 14 serving as the inter-layer insulator, thereby resulting in a formation of a stacked capacitor. A silicate glass film such as a boro-phospho-silicate glass film 18 is so formed as to cover an entire surface of the device, followed by a heat treatment thereby resulting in a reflow of the boro-phospho-silicate glass film 18. With respect to the reflow of the boro-phospho-silicate glass film 18, the planarization of the boro-phospho-silicate glass film 18 in the memory cell array area 110 is likely to be strongly promoted rather than that in the peripheral area 113, because the memory call area 110 has a dense pattern rather than the thin pattern of the peripheral circuit area 113.

Although the reflow of the boro-phospho-silicate glass film 18 caused by the heat treatment contributes the planarization or leveling of the surface of the device, but it is insufficient. Thus, the surface of the memory device has an irregularity. For example, the surface of the boro-phospho-silicate glass film 18 in the memory cell array area 110 exists at a higher level than that in the peripheral circuit area 113. The difference in heights of the surfaces of the memory cell array area and the peripheral circuit area 113 is mainly caused by the existence of the stacked capacitors 15, 16 and 17. The difference in heights of the both surfaces of the memory cell array area 110 and the peripheral circuit area 113 corresponds approximately to the height of the stacked capacitor 15, 16 and 17.

The difference in levels of surfaces of both the memory cell array area 110 and the peripheral circuit area 113 makes it difficult to accomplish the fine pattern by the photo-lithography. Thus, such irregularity in levels of the surface of the memory device causes a difference in depths of focus of the photo-lithography. This makes it difficult to implement the fine pattern and thus to promote the high integration.

Therefore, the realization of the high integration of the memory cell device requires the fine pattern of the photo-lithography. The implementation of the fine pattern requires the difference in levels of the surface of the device to be reduced, and thus the planarization of the surface of the device to be promoted.

To comply with the above requirements, the prior art employs a substrate including a recess portion on its surface at the memory cell array area 110. This technique is disclosed in 1988 VLSI symposium pp. 17–18, "A HALF MICRON TECHNOLOGY FOR AN EXPERIMENTAL 16 MBIT DRAM USING i-LINE STEPPER", Y. Kawamoto at al. Such technique for reduction of the difference in surface levels between the memory cell array area and the peripheral circuit area will subsequently be described with reference to FIG. 2.

A silicon substrate 1 including a memory cell array area 900 and a peripheral circuit area 901 is prepared, after which a surface of the silicon substrate 1 is subjected to a selective oxidation so that a silicon oxide film is formed in the surface of the silicon substrate 1, but only in the memory cell array area 900. Subsequently, the silicon oxide film is removed thereby resulting in a formation of a recessed portion in the surface in the memory cell array area 900. The existence of the recessed portion in the memory cell array area 900 of the silicon substrate 1 will be permissive of reducing the difference in surface levels of the memory cell array area 900 and the peripheral circuit area 901.

For understanding concretely the above advantages, the structure of the conventional DRAM cells formed on the p-type silicon substrate 1 including the recessed portion is described with reference to FIG. 3. The p-type silicon substrate 1 includes a recessed portion in the memory cell array area 110. Thus, the level of the surface in the memory cell array area 110 of the silicon substrate 1 is lower than that in the peripheral circuit area 113. The structure of the device illustrated in FIG. 3 is analogues to that of FIG. 1, except that the recess portion is formed in the surface of the substrate in the memory cell array area.

A p$^+$-type well region which is not illustrated is formed in the memory cell array area 110 of the p-type silicon substrate 1. Gate oxide films 11 are formed in the surfaces of the memory cell array area 110 and the peripheral circuit area 113 of the p-type silicon substrate 1. A field oxide film 10 is formed in the surface of the p-type silicon substrate 1 so as to separate the memory cell array area 110 from the peripheral circuit area 113. As the field oxide film 10 exists across the bounds between the memory cell array area 110 and the peripheral circuit area 113, the field oxide film 10 has a difference in level. Thus, a part of the Yield oxide film 10 overlays the surface of the substrate 1 in the memory cell array area 110 including the recessed portion. Both the field oxide film 10 and the gate oxide film 11 are formed by using a selective oxidation such as local oxidation of silicon (LOCOS). Gate electrodes 12 are formed on the gate oxide films 11 in the both memory cell array area 110 and peripheral circuit area 113. An ion-implantation of an impurity of opposite conductive type to the silicon substrate 1, or the donor is carried out by using the self-alignment technique so that source and drain diffusion regions 111 and 112 are formed in the memory cell array area 110 and in the peripheral circuit area 113, thereby resulting in a self-aligned gate structure. The result is that field effect transistors are formed in both the memory cell array area 110 and in the peripheral circuit area 113. The transistor involved in the memory cell array area 110 exists at a lower level than that in the peripheral circuit area 113 by a difference approximately in levels of the surfaces of the silicon substrate 1. A silicon oxide film 14 is formed by using a chemical vapor deposition so as to cover an entire surface of the device, and thus to cover the gate electrodes 12. The silicon oxide film 14 will serve as an interlayer insulator. A bottom electrode 15 of a stacked capacitor is formed in the memory cell array area 110 so as to be electrically connected to the source region 112 of the transistor. A capacitive insulation film 16 is so formed as to cover the bottom electrode 15 of the stacked capacitor. A top electrode 17 of the stacked capacitor is formed on the capacitive insulation film 16 and the silicon oxide film 14 serving as the interlayer insulator, thereby resulting in a formation of a stacked capacitor in the memory cell array area 110. A silicate glass film such as a boro-phospho-silicate glass film 18 is so formed as to cover an entire surface of the device, followed by a heat treatment thereby resulting in a reflow of the boro-phospho-silicate glass film 18. With respect to the reflow of the boro-phospho-silicate glass film 18, the planarization of the boro-phospho-silicate glass film 18 in the memory cell array area 110 is strongly promoted rather than that in the peripheral circuit area 113, because the memory call array area 110 has a dense pattern rather than the thin pattern of the peripheral circuit area 113.

Although the reflow of the boro-phospho-silicate glass film 18 caused by the heat treatment contributes the planarization, or leveling of the surface of the device, but it is insufficient. Since the silicon substrate 1 includes the recessed portion in the memory cell array area 110, the difference in levels of surfaces of the memory cell array area 110 and the peripheral circuit area 113 is, however, reduced by the depth of the recessed portion in the silicon substrate 1. Thus, the surface of the memory device has a reduced irregularity. The surface of the boro-phospho-silicate glass film 18 in the memory cell array area 110 is higher than that in the peripheral circuit area 113, but it is unremarkable. Thus, the recessed portion in the silicon substrate 1 enables the difference in levels of the surfaces of memory cell device to be substantially reduced so as to be unremarkable for the photo-lithography technique.

The unremarkable difference in levels of both the memory cell array area 110 and the peripheral circuit area 113 is free from the difficulty in accomplishment of the fine pattern by the photo-lithography. Thus, such unremarkable irregularity in levels of the surface of the memory device makes a difference in depths of focus of the photo-lithography unremarkable. This makes it possible to implement the fine pattern and thus to promote the high integration. Therefore, the silicon substrate 1 including the recessed portion promotes the realization of the high integration of the memory device provided by the fine pattern of the photo-lithography.

Although the formation of the recessed portion in the silicon substrate 1 contributes the realization of the high integration of the memory device, another problem with the transistor characteristics is still outstanding.

Then, the transistors in the memory cell array area 110 and the peripheral circuit area 113 are respectively required to have different performances, and thus properties from each other. The transistor characteristics, and thus performances depend upon the impurity concentrations in the silicon substrate 1, but at the surface region thereof, because a part of the surface region of the silicon substrate 1 serves as a channel region of the field effect transistor. The impurity concentration of the surface region of the silicon substrate 1 is required to be different between the memory cell array area 110 and the peripheral circuit area 113. It is desirable that the impurity concentrations in the memory cell array area 110 and in the peripheral circuit area 113 are respectively so determined that each of the transistors in the memory cell array area 110 and the peripheral circuit area 113 exhibits best performances and excellent properties. For example, the surface of the silicon substrate 1 in the memory cell array area 110 is required to have a higher impurity concentration than that in the peripheral area 113. The impurity concentration of the surface in the conventional silicon substrate 1 has, however, an uniformity. Then, the conventional silicon substrate 1 having the uniform impurity concentration at the surface is impossible of bringing out the best performance of each of the transistors in the memory cell array area 110 and in the peripheral circuit area 113.

Therefore, it is desirable that the silicon substrate 1 includes surface areas in the memory cell array area 110 and the peripheral circuit area 113 having suitable impurity concentrations different from each other. Needless to say, it is also desirable that the silicon substrate has a recessed portion at the memory cell array area 110, which makes the reduction of the difference in levels of the surface between the memory cell array area 110 and the peripheral circuit area 113. The realization of not only the higher integration but the excellent device performance requires the development of a novel silicon substrate and a novel method of fabricating the same.

SUMMARY OF THE INVENTION

Accordingly, it is a primary object of the present invention to provide a novel semiconductor substrate for an integrated circuit device, which is permissive of providing a high integration and a high quality performance of the device.

It is a further object of the present invention to provide a novel semiconductor substrate for an integrated circuit device, which has a recessed portion at a predetermined area and surface regions having different impurity concentrations each other, being suitable for bringing up best performances of the device.

It is another object of the present invention to provide a method of fabricating a novel semiconductor substrate for an integrated circuit device, which is permissive of providing a high integration and a high quality performance to the device.

It is still another object of the present invention to provide a method of fabricating a novel semiconductor substrate for an integrated circuit device, which has a recessed portion at a predetermined area and surface regions having different impurity concentrations each other, being suitable for bringing up best performances of the device.

The above and other objects, features and advantages of the present invention will be apparent from following descriptions.

The present invention essentially intends to provide an improved semiconductor substrate structure for a semiconductor integrated circuit device including a first multi-layer structure having a thickness and a second multi-layer structure having a smaller thickness than the thickness of the first multi-layer structure. The substrate structure comprises a first portion on which the first multi-layer structure is formed and a second portion on which the second multi-layer structure is formed. A first portion of the substrate structure includes a first surface region having a first impurity concentration of one conductive type in which the first surface region underlies a recessed portion. A second portion of the substrate structure includes a second surface region having a second impurity concentration being different from the first impurity concentration of the one conductive type in which the second surface region exists at a higher level than a level of the first surface region.

Further, the fist and second impurity concentrations are respectively so determined as to allow respective elements formed in the first and second multi-layer structures to exhibit best performances and most excellent properties.

The present invention also provides a novel semiconductor memory device which comprises the above improved semiconductor substrate, memory cell array portion having a thickness and including transistors and stacked capacitors and peripheral circuit portion including transistors and having a smaller thickness than the thickness of the memory array portion. The memory cell array portion is formed on the fist portion of the above semiconductor substrate. The peripheral circuit portion is formed on the second portion of the above semiconductor substrate.

The present invention also provides a novel method of forming an improved semiconductor substrate for a semiconductor integrated circuit device including as first multi-layer structure having a thickness formed in a predetermined area and a second multi-layer structure formed in a peripheral area having a smaller thickness than the thickness of the fist multi-layer structure. The novel method comprises following steps. An insulation film is selectively formed on a semiconductor substrate in the predetermined area in which the substrate has an impurity concentration. A semiconductor layer is selectively formed on the semiconductor substrate in the peripheral area in which the semiconductor layer has a lower impurity concentration than the impurity concentration of the semiconductor substrate. The insulation film is removed to form a recessed portion in the predetermined area.

The present invention also provides a novel method of forming an improved semiconductor substrate for a semiconductor integrated circuit device including as first multi-layer structure having a thickness formed in a predetermined area and a second multi-layer structure formed in a peripheral area having a smaller thickness than the thickness of the fist multi-layer structure. The novel method comprises following steps. An insulation film is selectively formed on the semiconductor substrate of one conductive type in the predetermined area in which the semiconductor substrate has an impurity concentration. A semiconductor layer of opposite conductive type is selectively formed on the semiconductor substrate in the peripheral area. The insulation film is removed to form a recessed portion in the predetermined area. An entire surface of the substrate is subjected to an ion-implantation of the one conductive type impurity thereby the semiconductor layer of the opposite conductive type becomes the one conductive type layer but having a lower impurity concentration of a surface region of the substrate in the predetermined area.

The present invention also provides a novel method of forming an improved semiconductor substrate for a semiconductor integrated circuit device including as first multi-layer structure having a thickness formed in a predetermined area and a second multi-layer structure formed in a peripheral area having a smaller thickness than the thickness of the fist multi-layer structure. The novel method comprises following steps. A first insulation film is formed on an entire surface of a semiconductor substrate having an impurity concentration. A second insulation film is selectively formed on the first insulation film in the peripheral area. A high impurity concentration planar region is formed in a surface of the semiconductor substrate in the predetermined area by using a selective ion-implantation of the same conductive type impurity as the semiconductor substrate. A thick insulation film is formed at a portion of the first insulation film in the predetermined area so as to depress the high impurity concentration planar region. The fist and second insulation films and the thick insulation film are removed to form a recessed portion in the predetermined area.

The present invention also provides a novel method of forming an improved semiconductor substrate for a semiconductor integrated circuit device including as first multi-layer structure having a thickness formed in a predetermined area and a second multi-layer structure formed in a peripheral area having a smaller thickness than the thickness of the fist multi-layer structure. The novel method comprises following steps. An insulation film is formed on an entire surface of a semiconductor substrate having an impurity concentration. A high impurity concentration planar region is formed in a surface of the semiconductor substrate in the predetermined area by using a selective ion-implantation of the same conductive type impurity as the semiconductor substrate. The insulation film in the predetermined area and an upper portion of the high impurity concentration planar region is subjected to selective etching by using a photoresist pattern so as to form a recessed portion in the predetermined area, followed by removing the insulation film.

The present invention also provides a novel method of forming an improved semiconductor substrate for a semiconductor integrated circuit device including as first multi-layer structure having a thickness formed in a predetermined area and a second multi-layer structure formed in a peripheral area having a smaller thickness than the thickness of the fist multi-layer structure. The novel method comprises following steps. A first insulation film is formed on an entire surface of a semiconductor substrate having an impurity concentration. A second insulation film is selectively formed on the first insulation film in the predetermined area. A well region is formed in a surface of the semiconductor substrate in the predetermined area by using a selective ion-implantation of opposite conductive type impurity to the conductive type of the semiconductor substrate. A high impurity concentration planar region is formed in the well region by using a selective ion-implantation of the same conductive type impurity as the semiconductor substrate. A thick insulation film is formed at a portion of the first insulation film in the predetermined area so as to depress the high impurity concentration planar region. The first and second insulation films and the thick insulation film are removed to form a recessed portion in the predetermined area.

The present invention also provides a novel method of forming an improved semiconductor substrate for a semiconductor integrated circuit device including as first multi-layer structure having a thickness formed in a predetermined area and a second multi-layer structure formed in a peripheral area having a smaller thickness than the thickness of the fist multi-layer structure. The novel method comprises following steps. An insulation film is formed on an entire surface of a semiconductor substrate having an impurity concentration. A well region is formed in a surface of the semiconductor substrate in the predetermined area by a selective ion-implantation of opposite conductive type impurity to the conductive type of the semiconductor substrate. The insulation film in the predetermined area and an upper portion of the high impurity concentration planar region is subjected to selective etching by using a photoresist pattern so as to form a recessed portion in the predetermined area, followed by removing the insulation film.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

The present invention essentially intends to provide a novel semiconductor substrate for a semiconductor integrated circuit device possessive of a high integration and excellent performances. The novel semiconductor substrate has a recessed portion and a high impurity concentration region underlying the recessed portion. Such novel semiconductor substrate is suitable for a semiconductor integrated circuit device including a large thickness multi-layer portion and a small thickness multi-layer portion in which the large thickness multi-layer portion is formed on the recessed portion overlaying the high impurity concentration region. The novel semiconductor substrate is applicable to a semiconductor memory cell device such as a dynamic random access memory cell device involving stacked capacitor cells formed in the memory cell array area in which transistors in the memory cell array area requires a substrate surface having a higher impurity concentration rather than that in the peripheral circuit area.

The present invention also intends to provide a novel method of fabricating the semiconductor substrate for a semiconductor integrated circuit device possessive of a high integration and excellent performances. The novel semiconductor substrate has a recessed portion and a high impurity concentration region underlying the recessed portion.

The preferred embodiments of the present invention will be described by using a semiconductor substrate for a semiconductor integrated circuit device such as a random access memory cell device. The device includes a memory cell array area involving stacked capacitor cells and a peripheral circuit area. The multilayer structure in the memory cell array area has a larger thickness than that in the peripheral circuit area. In addition, transistors involved in the memory cell array area requires a substrate surface having a higher impurity concentration rather than that required by transistors involved in the peripheral circuit area.

A first embodiment of the present invention will now be described with reference to FIGS. 4 and 5A to 5D.

Figure 4:
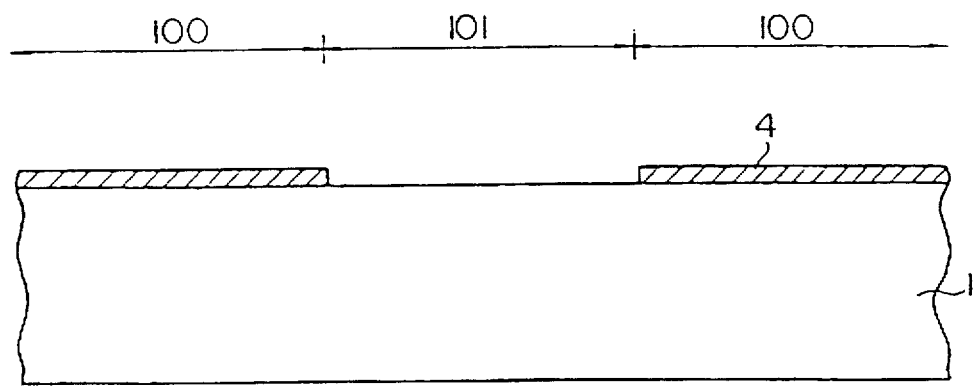
FIG. 4 is a fragmentary cross sectional elevation view illustrative of a novel structure of a semiconductor substrate of a first embodiment according to the present invention.

With reference to FIG. 4, a substrate 1 is made of silicon which is doped with the p-type dopant so as to have an uniform impurity concentration. Such p-type silicon substrate includes a memory cell array area 101 on which a memory cell array will be formed and a peripheral circuit area 100 on which a peripheral circuit will be formed. A selective silicon layer 4 overlays the peripheral circuit area 100 of the p-type silicon substrate 1, and thus the selective silicon layer 4 covers a surface of the silicon substrate 1 except for the memory cell array area 101 thereby resulting in a formation of a recessed portion in the memory cell array area 101. The selective silicon layer 4 is doped with the same conductive type impurity as the silicon substrate 1, but so as to have a lower impurity concentration than the impurity concentration of the p-type silicon substrate 1. The impurity concentrations of both the p-type silicon substrate 1 and the selective silicon layer 4 are respectively so determined as to cause both transistors existing in the memory cell array area 101 and in the peripheral circuit area 100 to exhibit the best performances and most excellent properties.

Consequently, the surface of the p-type silicon substrate 1 having a high impurity concentration is exposed except for the peripheral circuit area 100, and thus in the memory cell array area 101 only. The selective silicon layer 4 having a low impurity concentration overlays the surface of the p-type silicon substrate 1 but only the peripheral circuit area 100 so as to form the recessed portion in the memory cell array area 101.

A novel method of fabricating the silicon substrate 1 of the first embodiment according to the present invention will subsequently be described with reference to FIGS. 5A to 5D.

Figure 5A:
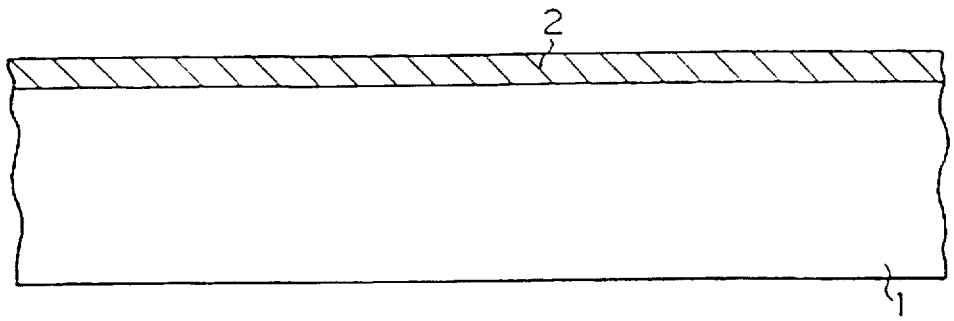
FIGS. 5A to 5D are fragmentary cross sectional elevation view illustrative of sequential steps involved in a novel method of fabricating a semiconductor substrate illustrated in FIG. 4.

With reference to FIG. 5A, a p-type silicon substrate is prepared, after which a silicon oxide film 2 is deposited on an entire surface of the p-type silicon substrate 1 up to a thickness of 4000 angstroms by using a deposition method such as a chemical vapor deposition.

Figure 5B:
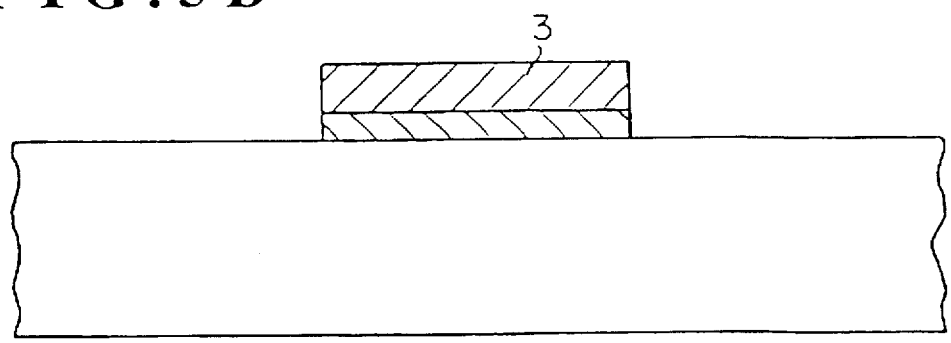

With reference to FIG. 5B, a photo-resist pattern 3 which will serve as a mask member for etching process is prepared and an alignment of the photo-resist pattern 3 is so accomplished that the photo-resist pattern 3 overlays the silicon oxide film 2, but only in a predetermined area corresponding to the memory cell array area 101. An etching process for the silicon oxide film 2 is accomplished by using the photoresist pattern 3 as a mask member. As a result of the etching process, the silicon oxide film 2 is removed except for a portion underlying the photo-resist pattern 3, and thus a portion of the silicon oxide film 2 corresponding to the peripheral area is removed so as to have the silicon oxide film 2 remain only in the predetermined area corresponding to the memory cell array area 101.

Figure 5C:
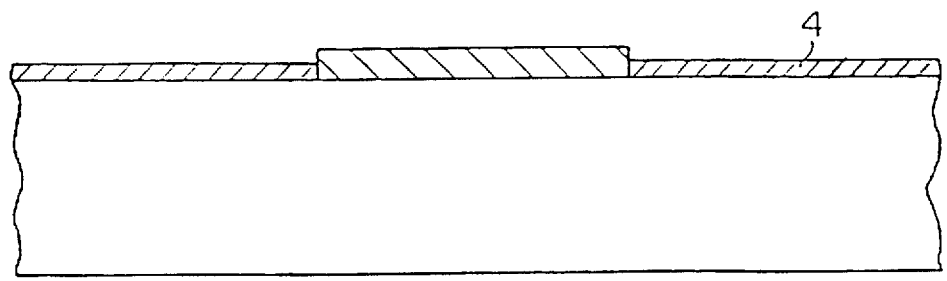

With reference to FIG. 5C, the photo-resist pattern 3 which has finished serving as the mask member overlying the remaining silicon oxide film 2 is removed. A selective silicon layer 4 is deposited up to a thickness of approximately 2000 angstroms by a selective growth on the surface of the silicon substrate 1, except on the remaining silicon oxide film 2. As a result of those, the selective silicon layer 4 overlays and covers the exposed surface of the p-type silicon substrate 1 in the peripheral circuit area 100. The selective silicon layer 4 is doped with the same conductive type impurity as the p-type silicon substrate 1. But, it is important that the selective silicon layer 4 has a lower impurity concentration than that of the p-type silicon substrate 1.

Consequently, the surface of the p-type silicon substrate 1 in the memory cell array area 101 is covered by the remaining silicon oxide film 2. The surface of the p-type silicon substrate 1 in the peripheral circuit area 100 is covered by the selective silicon layer 4.

Figure 5D:
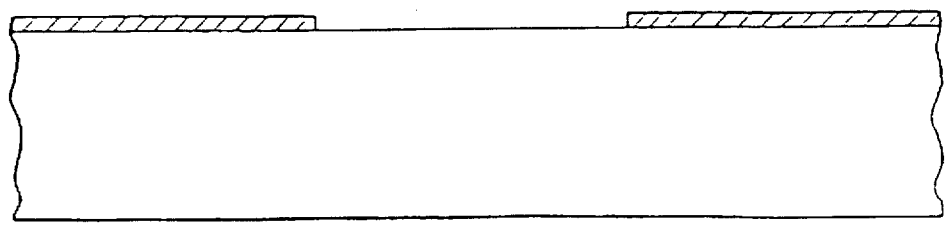

With reference to FIG. 5D, the remaining silicon oxide film 2 is removed, by which the surface of the p-type silicon substrate 1 is exposed, but only in the predetermined area corresponding to the memory cell array area 101, thereby resulting in a formation of a recessed portion in the memory cell array area 101 defined by the selective silicon layer 4.

Therefore, the recessed portion defined by the selective silicon layer 4 is formed in the surface of the substrate but in the memory cell array area 101. The recessed portion of the substrate overlays the exposed surface of the silicon substrate 1 having a higher impurity concentration than that of the selective silicon layer 4.

A second embodiment of the present invention will now be described with reference to FIGS. 6 and 7A to 7E.

Figure 6:
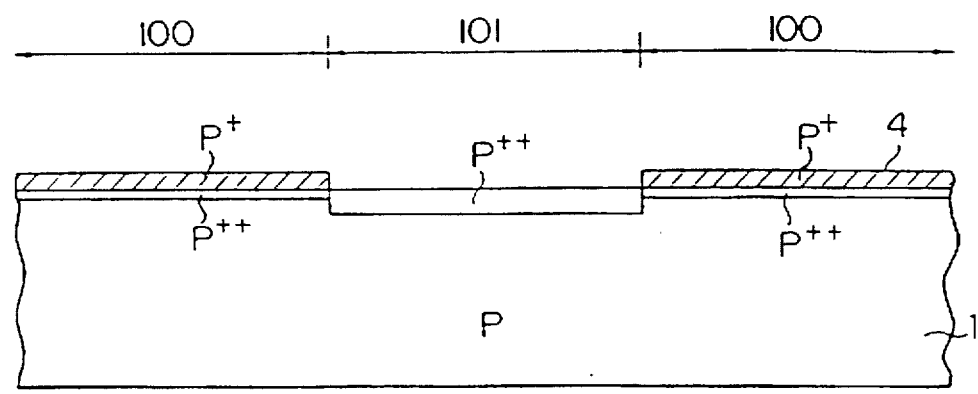
FIG. 6 is a fragmentary cross sectional elevation view illustrative of a novel structure of a semiconductor substrate of a second embodiment according to the present invention.

With reference to FIG. 6, a substrate 1 is made of silicon which is doped with the p-type dopant so as to have an uniform impurity concentration. Such p-type silicon substrate 1 includes a memory cell array area 101 on which a memory cell array will be formed and a peripheral circuit area 100 on which a peripheral circuit will be formed. A selective silicon layer 4 overlays the peripheral circuit area 100 of the p-type silicon substrate 1, and thus the selective silicon layer 4 covers a surface of the silicon substrate 1 except for the memory cell array area 101 thereby resulting in a formation of a recessed portion in the memory cell array area 101. The selective silicon layer 4 has the same conductive type impurity as the silicon substrate 1, but at a higher impurity concentration than the impurity concentration of the p-type silicon substrate 1. An exposed upper planar region having a thickness of the silicon substrate 1 directly under the recessed portion in the memory cell array area 101, however, has a higher impurity concentration than that of the above $p^+$-type selective silicon layer 4. A peripheral planar upper region having a thickness of the silicon substrate 1 directly under the $p^+$-type selective silicon layer 4 also has a higher impurity concentration than that of the $p^+$-type selective silicon layer 4. The $p^{++}$-type exposed upper planar region of the silicon substrate 1 has a larger thickness than that of the $p^{++}$-type peripheral upper planar region in the silicon substrate 1. The p-type silicon substrate 1 is overlaid by the high impurity concentration planar region which comprises both the $p^{++}$-type exposed upper planar region directly under the recessed portion in the memory cell array area 101 and the $p^{++}$-type peripheral upper planar region directly under the $p^+$-type selective silicon layer 4 in the peripheral circuit area 100. The impurity concentrations of both the $p^{++}$-type exposed upper planar region and the $p^+$-type selective silicon layer 4 are respectively so determined as to cause both transistors existing in the memory cell array area 101 and in the peripheral circuit area 100 to exhibit the best performances and most excellent properties.

Consequently, the substrate surface comprises the $p^{++}$-type exposed upper planar region underlying the recessed portion in the memory cell array area 101 and the $p^+$-type selective silicon layer 4 existing in the peripheral circuit area 100 in which the $p^+$-type selective silicon layer 4 has a lower impurity concentration than that of the $p^{++}$-type exposed upper planar region.

A novel method of fabricating the silicon substrate 1 of the second embodiment according to the present invention will subsequently be described with reference to FIGS. 7A to 7E.

Figure 7A:
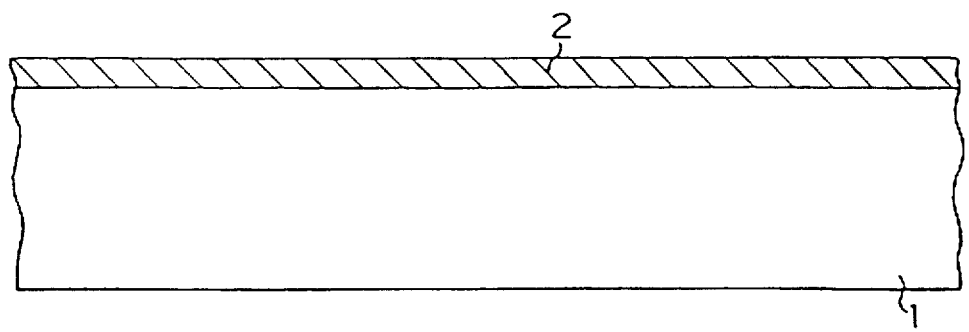
FIGS. 7A to 7E are fragmentary cross sectional elevation view illustrative of sequential steps involved in a novel method of fabricating a semiconductor substrate illustrated in FIG. 6.

With reference to FIG. 7A, a p-type silicon substrate is prepared, after which a silicon oxide film 2 is deposited on an entire surface of the p-type silicon substrate 1 up to a thickness of 4000 angstroms by using a deposition method such as a chemical vapor deposition.

Figure 7B:
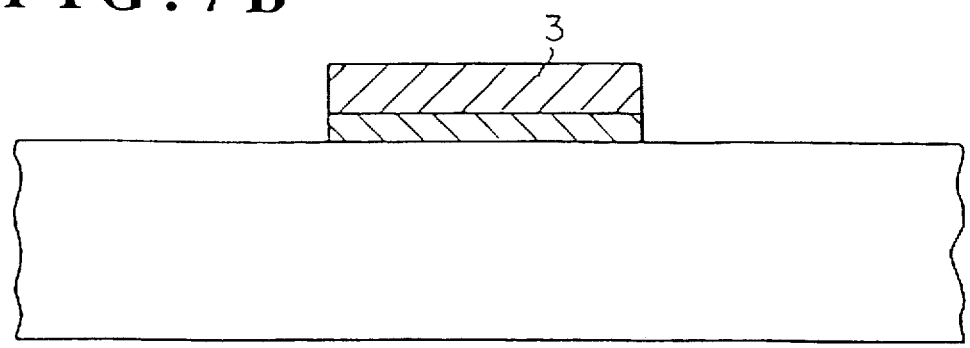

With reference to FIG. 7B, a photo-resist pattern 3 which will serve as a mask member for etching process is prepared and an alignment of the photo-resist pattern 3 is so accomplished that the photo-resist pattern 3 overlays the silicon oxide film 2, but only in a predetermined area corresponding to the memory cell array area 101. An etching process for the silicon oxide film 2 is accomplished by using the photoresist pattern 3 as a mask member. As a result of the etching process, the silicon oxide film 2 is removed except for a portion underlying the photo-resist pattern 3, and thus a portion of the silicon oxide film 2 in the peripheral circuit area 100 is removed so as to have the silicon oxide film 2 remain only in the predetermined area corresponding to the memory cell array area 101.

Figure 7C:
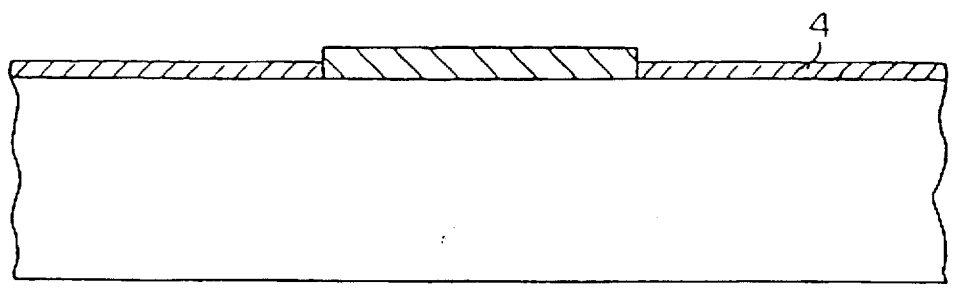

With reference to FIG. 7C, the photo-resist pattern 3 which has finished serving as the mask member overlying the remaining silicon oxide film 2 is removed. A selective silicon layer 4 is deposited up to a thickness of approximately 2000 angstroms by a selective growth on the surface of the silicon substrate 1 except on the remaining silicon oxide film 2. As a result of those, the selective silicon layer 4 overlays and covers the exposed surface of the p-type silicon substrate 1. The selective silicon layer 4 is doped with opposite conductive type impurity to that of the p-type silicon substrate 1. At that time, the selective silicon layer 4 includes an n-type impurity. Consequently, the surface of the p-type silicon substrate 1 in the memory cell array area 101 is covered by the remaining silicon oxide film 2. The surface of the p-type silicon substrate 1 in the peripheral circuit area 100 is covered by the selective silicon layer 4.

Figure 7D:
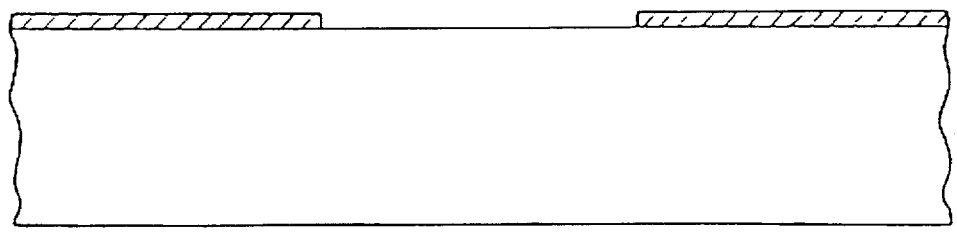

With reference to FIG. 7D, the remaining silicon oxide film 2 is removed, by which the surface of the p-type silicon substrate 1 is exposed, but only in the predetermined area corresponding to the memory cell array area 101, thereby resulting in a formation of a recessed portion in the memory cell array area 101 defined by the selective silicon layer 4.

Figure 7E:
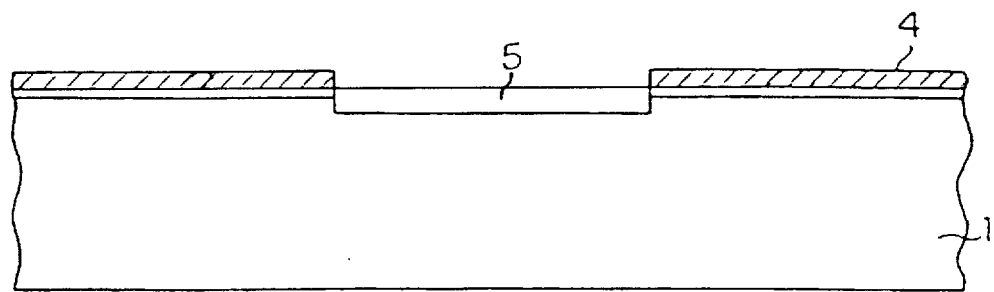

With reference to FIG. 7E, an ion-implantation of the p-type impurity is carried out so that an entire surface of the substrate, and thus both the n-type selective silicon layer 4 in the peripheral circuit area 100 and the exposed surface of the p-type silicon substrate directly under the recessed portion in the memory cell array area 101 are subjected to doping with the p-type dopant. The ion-implantation of the p-type dopant is carried out until at least the conductive type of the selective silicon layer 4 is changed into an opposite conductive type, and thus the selective silicon layer 4 has a $p^+$-type impurity concentration. Concurrently, the exposed upper planar region 5 having a thickness of the n-type silicon substrate 1 directly under the recessed portion is made into a $p^{++}$-type exposed upper planar region having a higher impurity concentration than that of the $p^+$-type selective silicon layer 4. Further, the doped p-type impurity passes through the selective silicon layer 4 and reaches an upper region of the silicon substrate 1 underlying the selective silicon layer 4. Then, the peripheral upper planar region having a thickness of the p-type silicon substrate 1 directly under the $p^+$-type selective silicon layer 4 is made into a $p^{++}$-type peripheral upper planar region having a higher impurity concentration than that of the $p^+$-type selective silicon layer 4.

Therefore, the recessed portion defined by the selective silicon layer 4 is formed in the surface of the substrate but in the memory cell array area. The recessed portion of the substrate overlays the $p^{++}$-type exposed upper planar region 5 of the silicon substrate 1, which has a higher impurity concentration than that of the $p^+$-type selective silicon layer 4.

A third embodiment of the present invention will now be described with reference to FIGS. 8 and 9A to 9D.

Figure 8:
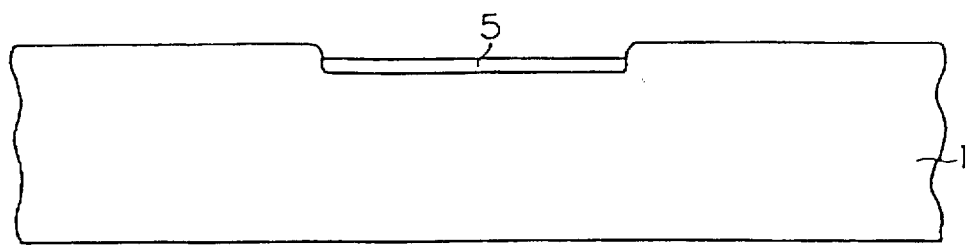
FIG. 8 is a fragmentary cross sectional elevation view illustrative of a novel structure of a semiconductor substrate of a third embodiment according to the present invention.

With reference to FIG. 8, a substrate 1 is made of silicon which is doped with the p-type dopant so as to have an uniform impurity concentration. Such p-type silicon substrate 1 includes a memory cell array area 101 on which a memory cell array will be formed and a peripheral circuit area 100 on which a peripheral circuit will be formed. A recessed portion is formed in the memory cell array area 101. A high impurity concentration planar region 5 having a thickness is formed in the surface of the silicon substrate 1, but directly under the recessed portion in the memory cell array area 101. The high impurity concentration planar region 5 has a higher impurity concentration than that of the p-type silicon substrate 1.

Thus, the p-type silicon substrate 1 includes the high impurity concentration planar region 5 existing directly under the recessed potion in the memory cell array area 101. The impurity concentrations of both the high impurity concentration planar region 5 and the p-type silicon substrate 1 are respectively so determined as to cause both transistors existing in the memory cell array area 101 and in the peripheral circuit area 100 to exhibit best performances and most excellent properties.

Consequently, the substrate surface comprises the high impurity concentration planar region 5 underlying the recessed portion in the memory cell array area 101 and the surface region of the p-type silicon substrate 1 in the peripheral circuit area 100 in which the p-type silicon substrate 1 has a lower impurity concentration than that of the high impurity concentration planar region 5.

A novel method of fabricating the silicon substrate 1 of the third embodiment according to the present invention will subsequently be described with reference to FIGS. 9A to 9D.

Figure 9A:
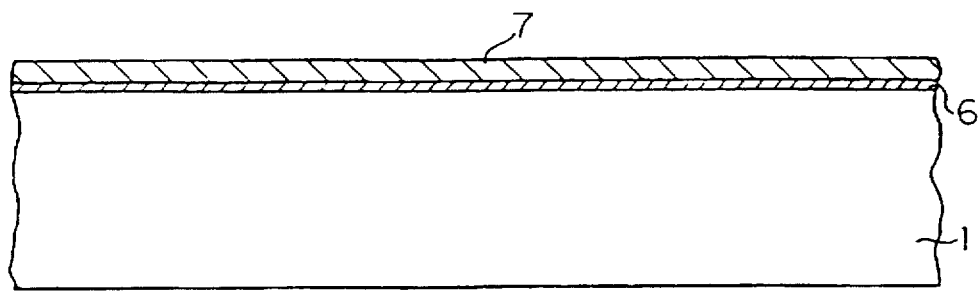
FIGS. 9A to 9D are fragmentary cross sectional elevation view illustrative of sequential steps involved in a novel method of fabricating a semiconductor substrate illustrated in FIG. 8.

With reference to FIG. 9A, a p-type silicon substrate 1 is prepared, after which a surface of the p-type silicon substrate 1 is subjected to a thermal oxidation thereby a silicon oxide film 6 having a thickness of approximately 500 angstroms is formed on the surface of the p-type silicon substrate 1. A deposition such as a chemical vapor deposition of silicon nitride is carried out so that a silicon nitride film 7 is deposited on the silicon oxide film 6 up to a thickness of approximately 3000 angstroms.

Figure 9B:
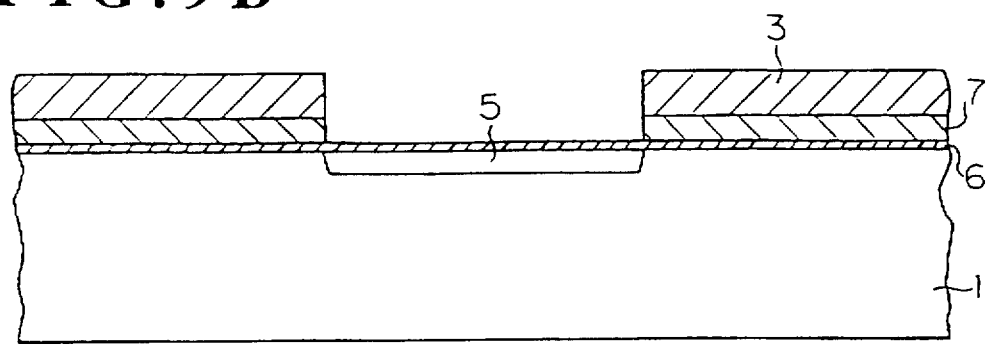

With reference to FIG. 9B, a photo-resist pattern 3 which will serve as a mask member for etching process is prepared and an alignment of the photo-resist pattern 3 is so accomplished that the photo-resist pattern 3 overlays the silicon nitride film 7, but directly over the peripheral circuit area corresponding to the memory cell array area 101. An etching process for the silicon nitride film 7 is accomplished by using the photo-resist pattern 3 as a mask member. As a result of the etching process, the silicon nitride film 7 is removed except for a portion underlying the photo-resist pattern 3, and thus a portion of the silicon nitride film 7 in the memory cell array area 101 is removed so as to have the silicon nitride film 7 remain only in the peripheral circuit area 100. The silicon oxide film 6, however, remains not only in the peripheral circuit area 100 directly under the photo-resist pattern 3 but in the memory cell array area 101. After that, an ion-implantation of the same conductive type impurity as the p-type silicon substrate 1 is accomplished where the photo-resist pattern 3 and the remaining silicon nitride film 7 existing in the peripheral circuit area serve as mask members. In the memory cell array area 101, such p-type impurity supplied by the ion-implantation passes through the silicon oxide film 6 and reaches the surface of the p-type silicon substrate 1. Then, the surface of the p-type silicon substrate in the memory cell array area 101 is subjected to the selective ion-implantation of such p-type impurity. As a result of those, a high impurity concentration planar region 5 having a thickness is formed in the surface of the p-type silicon substrate 1 in the memory cell array area 101 which is not covered by the silicon nitride film 7 and the photo-resist pattern 3.

Figure 9C:
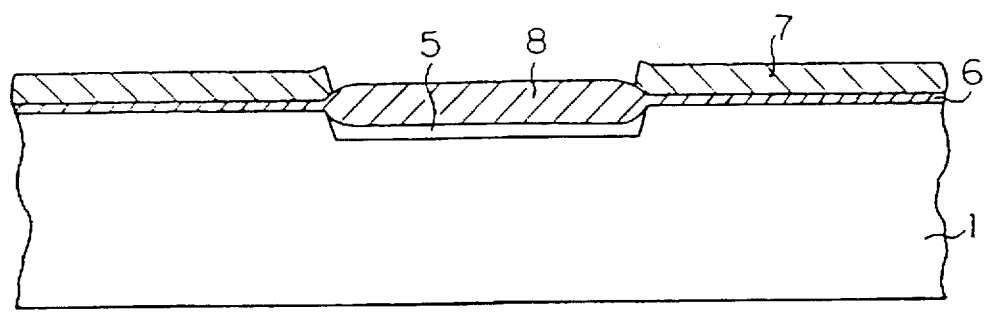

With reference to FIG. 9C, the photo-resist pattern 3 which has finished serving as the mask member overlying the remaining silicon nitride film 7 is removed. A thermal oxidation is so accomplished that a thick silicon oxide film 8 having a thickness of approximately 4000 angstroms is formed at a portion of the silicon oxide film 6 overlaying the high impurity concentration planar region 5 in the memory cell array area 101, and thus the surface of the high impurity concentration planar region 5 is oxidized up to a depth of approximately 2000 angstroms and made into an under portion of the thick silicon oxide film 8. Thus, the formation of the thick silicon oxide film 8 depresses the high impurity concentration planar region 5.

Figure 9D:
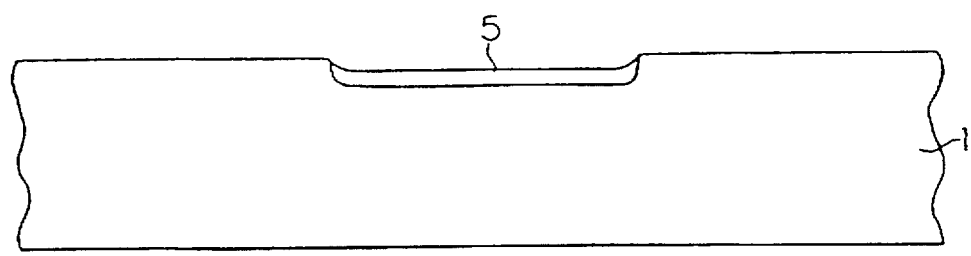

With reference to FIG. 9D, the remaining silicon nitride film 7 is removed. Further, the silicon oxide film 6 and the thick silicon oxide film 8 are removed respectively, thereby resulting in a formation of a recessed portion directly over the high impurity concentration planar region 5 which is depressed by the above thermal oxidation process.

Therefore, the silicon substrate 1 includes the high impurity planar region 5 at its surface in the memory cell array area 101 and the exposed surface of the substrate 1 having a lower impurity concentration than that of the high impurity concentration planar region 5. The high impurity concentration planar region 5 underlies the recessed portion formed in the memory cell array area.

A fourth embodiment of the present invention will now be described with reference to FIGS. 10A to 10C.

A substrate of a fourth embodiment according to the present invention has the same structure completely as the substrate of the third embodiment. Thus, descriptions and illustrations of the structure of the substrate of the fourth embodiment are omitted. The invention of the fourth embodiment, however, provides another method of fabricating the silicon substrate. Another fabrication method method of the third embodiment according to the present invention will subsequently be described with reference to FIGS. 10A to 10C.

Figure 10A:
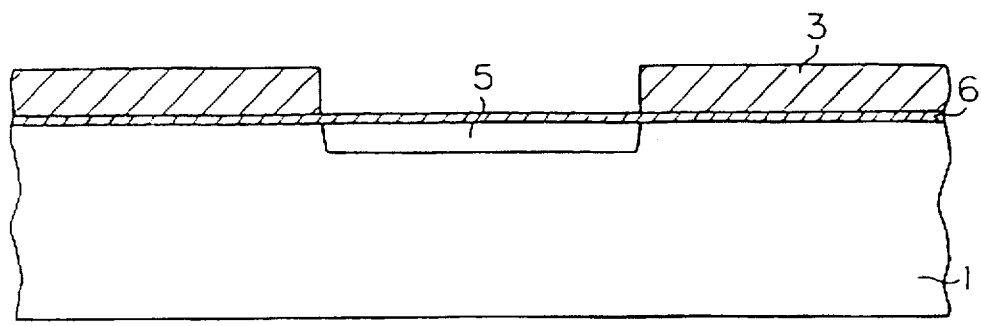
FIGS. 10A to 10C are fragmentary cross sectional elevation view illustrative of sequential steps involved in another novel method of fabricating a semiconductor substrate illustrated in FIG. 8 in a fourth embodiment of the present invention.

With reference to FIG. 10A, a p-type silicon substrate 1 is prepared, after which a surface of the p-type silicon substrate 1 is subjected to a thermal oxidation thereby a silicon oxide film 6 having a thickness of approximately 500 angstroms is formed on the surface of the p-type silicon substrate 1. A photo-resist pattern 3 which will serve as a mask mask for ion-implantation process is prepared and an alignment of the photo-resist pattern 3 is so accomplished that the photo-resist pattern 3 overlays the silicon oxide film 6, but in a peripheral circuit area 100. After that, an ion-implantation of the same conductive type impurity as the p-type silicon substrate 1 is accomplished where the photo-resist pattern 3 existing in the peripheral circuit area serve as mask members. In the memory cell array area 101, such p-type impurity supplied by the ion-implantation passes through the silicon oxide film 6 and reaches the surface of the p-type silicon substrate 1. Then, the surface of the p-type silicon substrate 1 in the memory cell array area 101 is subjected to the selective ion-implantation of such p-type impurity. As a result of those, a high impurity concentration planar region 5 having a thickness is formed in the surface of the p-type silicon substrate 1 in the memory cell array area 101 which is not covered by the photo-resist pattern 3.

Figure 10B:
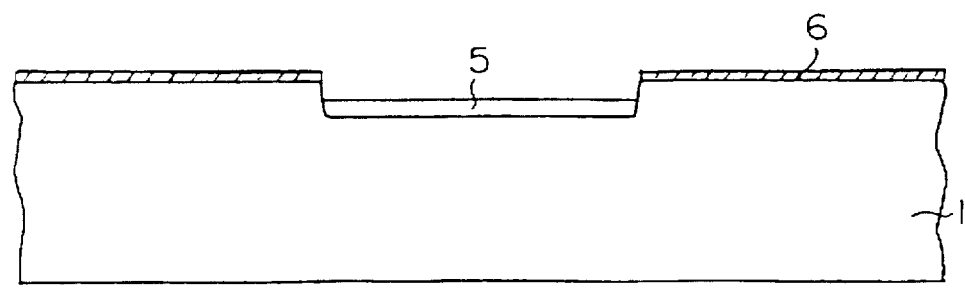

With reference to FIG. 10B, an etching process for the silicon oxide film 6 and a surface region of the high impurity concentration region 5 is accomplished by using the photo-resist pattern 3 as a mask member. As a result of the etching process, the silicon oxide film 6 is removed except for a portion underlying the photo-resist pattern 3, and thus a portion of the silicon oxide film 6 in the memory cell array area 101 is removed thereby the surface of the high impurity concentration planar region 5 is exposed. Subsequently, the exposed surface of the high impurity concentration region 5 is subjected to the etching thereby a recessed portion is formed in the surface of the high impurity concentration planar region 5. After that, the photo-resist pattern 3 which has finished serving as the mask member overlying the remaining silicon oxide film 6 is removed.

Figure 10C:
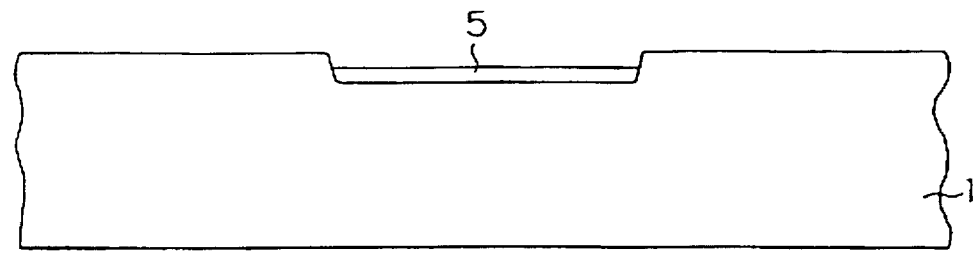

With reference to FIG. 10C, the silicon oxide film 6 is removed, thereby the surface of the silicon substrate is exposed but in the peripheral circuit area 100.

Therefore, the silicon substrate 1 includes the high impurity concentration planar region 5 at its surface in the memory cell array area 101 and the exposed surface of the substrate 1 having a lower impurity concentration than that of the high impurity concentration planar region 5. The high impurity concentration planar region 5 underlies the recessed portion formed in the memory cell array area 101.

A fifth embodiment of the present invention will now be described with reference to FIGS. 11 and 12A to 12E.

Figure 11:
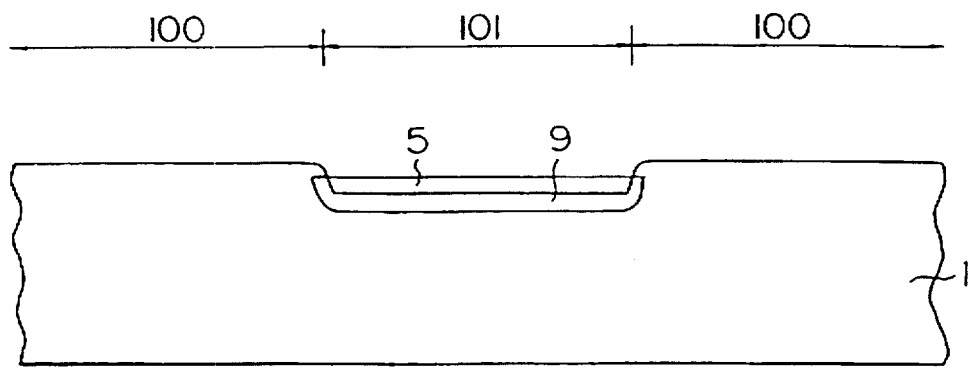
FIG. 11 is a fragmentary cross sectional elevation view illustrative of a novel structure of a semiconductor substrate of a fifth embodiment according to the present invention.

With reference to FIG. 11, the structure of the substrate of the fifth embodiment is analogous to those of the third and fourth embodiments except for the existence of an opposite conductive type well region. A substrate 1 is made of silicon which is doped with the p-type dopant so as to have an uniform impurity concentration. Such p-type silicon substrate 1 includes a memory cell array area 101 on which a memory cell array will be formed and a peripheral circuit area 100 on which a peripheral circuit will be formed. A recessed portion is formed in the memory cell array area 101. A high impurity concentration planar region 5 having a thickness is formed in the surface of the silicon substrate 1, but directly under the recessed portion in the memory cell array area 101. The high impurity concentration planar region 5 has a higher impurity concentration than that of the p-type silicon substrate 1. The high impurity concentration planar region 5 is the same conductive type as the p-type silicon substrate 1. Thus, the p-type silicon substrate 1 includes the high impurity concentration planar region 5 existing directly under the recessed potion in the memory cell array area 101. The impurity concentrations of both the high impurity concentration planar region 5 and the p-type silicon substrate 1 are respectively so determined as to cause both transistors existing in the memory cell array area 101 and in the peripheral circuit area 100 to exhibit best performances and most excellent properties. Further, an n-type well region 9 having opposite conductive type to the p-type silicon substrate 1 is formed under the high impurity concentration planar region 5.

Consequently, the substrate surface comprises the high impurity concentration planar region 5 underlying the recessed portion in the memory cell array area 101 and the surface region of the p-type silicon substrate 1 in the peripheral circuit area 100 in which the p-type silicon substrate 1 has a lower impurity concentration than that of the high impurity concentration planar region 5.

A novel method of fabricating the substrate of the fifth embodiment according to the present invention will subsequently be described with reference to FIGS. 12A to 12E.

Figure 12A:
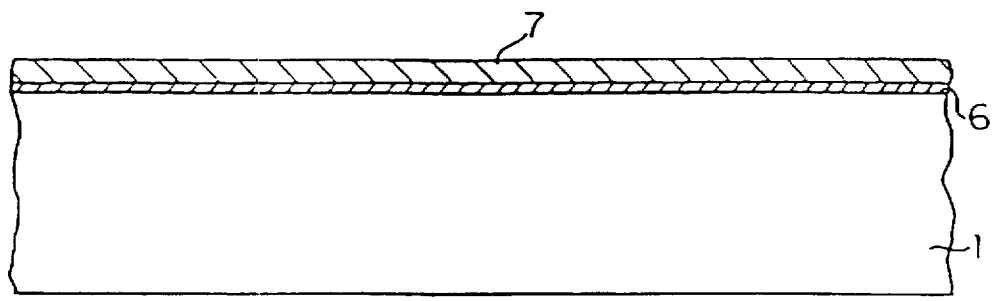
FIGS. 12A to 12E are fragmentary cross sectional elevation view illustrative of sequential steps involved in a novel method of fabricating a semiconductor substrate illustrated in FIG. 11.

With reference to FIG. 12A, a p-type silicon substrate 1 is prepared, after which a surface of the p-type silicon substrate 1 is subjected to a thermal oxidation thereby a silicon oxide film 6 having a thickness of approximately 500 angstroms is formed on the surface of the p-type silicon substrate 1. A deposition such as a chemical vapor deposition of silicon nitride is carried out so that a silicon nitride film 7 is deposited on the silicon oxide film 6 up to a thickness of approximately 3000 angstroms.

Figure 12B:
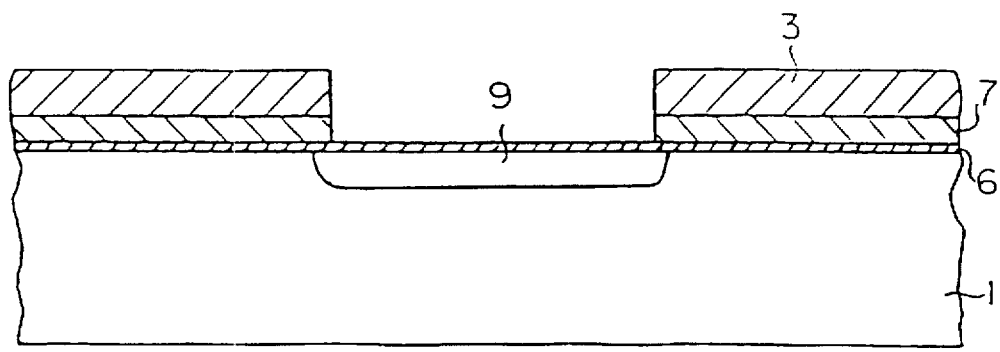

With reference to FIG. 12B, a photo-resist pattern 3 which will serve as a mask member for etching process is prepared and an alignment of the photo-resist pattern 3 is so accomplished that the photo-resist pattern 3 overlays the silicon nitride film 7, but only in the peripheral circuit area 100. An etching process for the silicon nitride film 7 is accomplished by using the photo-resist pattern 3 as a mask member. As a result of the etching process, the silicon nitride film 7 is removed except for a portion underlying the photo-resist pattern 3, and thus a portion of the silicon nitride film 7 in the memory cell array area 101 is removed so as to have the silicon nitride film 6 remain only in the peripheral circuit area 100. The silicon oxide film 6, however, remains not only in the peripheral circuit area 100 directly under the photo-resist pattern 3 but in the memory cell array area 101. After that, an ion-implantation of opposite conductive type impurity to the p-type silicon substrate 1 is accomplished where the photo-resist pattern 3 and the remaining silicon nitride film 7 existing in the peripheral circuit area 100 serves as a mask member. In the memory cell array area 101, such n-type impurity supplied by the ion-implantation passes through the silicon oxide film 6 and reaches the surface of the p-type silicon substrate 1. Then, the surface of the p-type silicon substrate 1 in the memory cell array area 101 is subjected to the selective ion-implantation of such n-type impurity. As a result of those, an n-type well region 9 is formed in the surface of the p-type silicon substrate 1 in the memory cell array area 101 which is not covered by the silicon nitride film 7 and the photo-resist pattern 3.

Figure 12C:
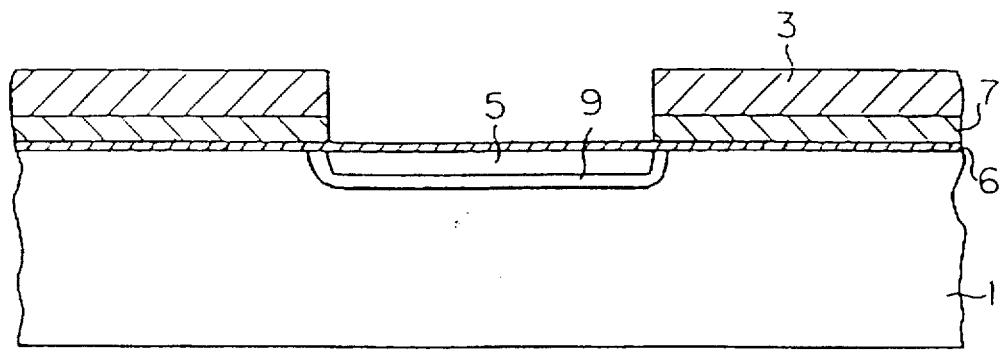

With reference to FIG. 12C, an ion-implantation of the same conductive type impurity as the p-type silicon substrate 1 is accomplished where the photo-resist pattern 3 and the remaining silicon nitride film 7 existing in the peripheral circuit area 100 also serves as a mask member. In the memory cell array area 101, such p-type impurity supplied by the ion-implantation passes through the silicon oxide film 6 and reaches a surface region of the n-type well region 9 formed in the surface of the p-type silicon substrate 1. Then, the surface region of the n-type well region 9 in the memory cell array area 101 is subjected to the selective ion-implantation of such p-type impurity. As a result of those, a p-type high impurity concentration planar region 5 having a thickness is formed in the surface region of the n-type well region 9 in the memory cell array area 101 which is not covered by the silicon nitride film 7 and the photo-resist pattern 3. Thus, the p-type high impurity concentration planar region 5 overlays the n-type well region 9.

Figure 12D:
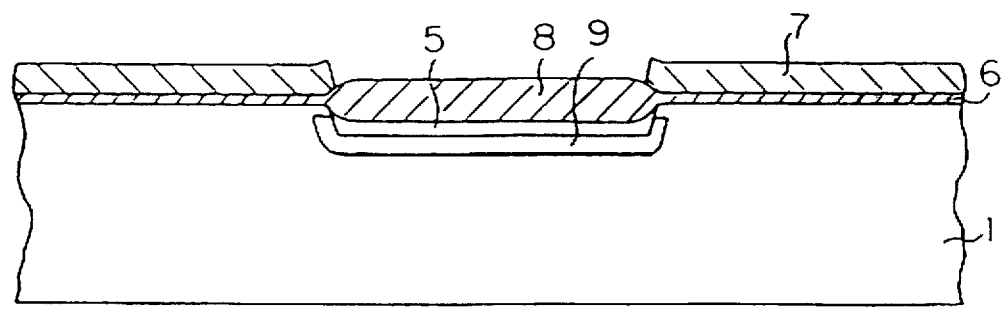

With reference to FIG. 12D, the photo-resist pattern 3 which has finished serving as the mask member overlying the remaining silicon nitride film 7 is removed. A thermal oxidation is so accomplished that a thick silicon oxide film 8 having a thickness of approximately 4000 angstroms is formed at a portion of the silicon oxide film 6 overlaying the high impurity concentration planar region 5 in the memory cell array area 101, and thus the surface of the high impurity concentration planar region 5 is oxidized up to a depth of approximately 2000 angstroms and made into an under portion of the thick silicon oxide film 8. Thus, the formation of the thick silicon oxide film 8 depresses the high impurity concentration planar region 5.

Figure 12E:
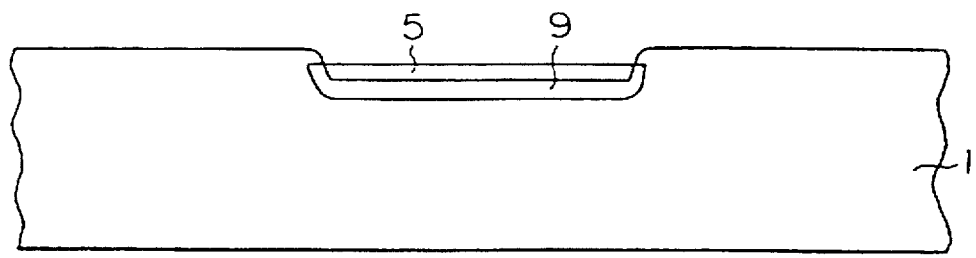

With reference to FIG. 12E, the remaining silicon nitride film 7 is removed. Further, the silicon oxide film 6 and the thick silicon oxide film 8 are removed respectively, thereby resulting in a formation of a recessed portion directly over the high impurity concentration planar region 5 which is depressed by the above thermal oxidation process.

Therefore, the silicon substrate 1 includes the high impurity planar region 5 at its surface in the memory cell array area 101 and the exposed surface of the substrate 1 having a lower impurity concentration than that of the high impurity concentration planar region 5. The high impurity concentration planar region 5 underlies the recessed portion formed in the memory cell array area.

A sixth embodiment of the present invention will now be described with reference to FIGS. 13A to 13C.

A substrate of a sixth embodiment according to the present invention has the same structure completely as the substrate of the fifth embodiment. Thus, descriptions and illustrations of the structure of the substrate of the fourth embodiment are omitted. The invention of the sixth embodiment, however, provides another method of fabricating the silicon substrate. Another fabrication method of the sixth embodiment according to the present invention will subsequently be described with reference to FIGS. 13A to 13C.

Figure 13A:
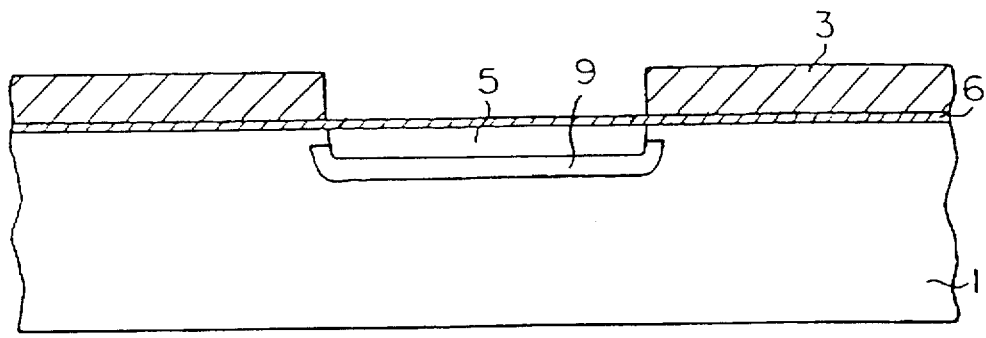
FIGS. 13A to 13C are fragmentary cross sectional elevation view illustrative of sequential steps involved in another method of fabricating a semiconductor substrate illustrated in FIG. 11 in a sixth embodiment of the present invention.

With reference to FIG. 13A, a p-type silicon substrate 1 is prepared, after which a surface of the p-type silicon substrate 1 is subjected to a thermal oxidation thereby a silicon oxide film 6 having a thickness of approximately 500 angstroms is formed on the surface of the p-type silicon substrate 1. A photo-resist pattern 3 which will serve as a mask member for ion-implantation process is prepared and an alignment of the photo-resist pattern 3 is so accomplished that the photo-resist pattern 3 overlays the silicon oxide film 6, but in the peripheral circuit area 100. After that, an ion-implantation of opposite conductive type impurity to the p-type silicon substrate 1 is accomplished where the photo-resist pattern 3 existing in the peripheral circuit area 100 serves as a mask member. In the memory cell array area 101, such n-type impurity supplied by the ion-implantation passes through the silicon oxide film 6 and reaches the surface of the p-type silicon substrate 1. Then, the surface of the p-type silicon substrate in the memory cell array area 101 is subjected to the selective ion-implantation of such n-type impurity. As a result of those, an n-type well region 9 is formed in the surface of the p-type silicon substrate 1 in the memory cell array area 101 which is not covered by the photo-resist pattern 3.

Further, an ion-implantation of the same conductive type impurity as the p-type silicon substrate 1 is accomplished where the photo-resist pattern 3 existing in the peripheral circuit area also serve as a mask member. In the memory cell array area 101, such p-type impurity supplied by the ion-implantation passes through the silicon oxide film 6 and reaches the surface region of the n-type well region 9. Then, the surface region of the n-type well region 9 in the memory cell array area 101 is subjected to the selective ion-implantation of such p-type impurity. As a result of those, a p-type high impurity concentration planar region 5 having a thickness is formed in the surface region of the n-type well region 9 in the memory cell array area 101 which is not covered by the photo-resist pattern 3. Thus, the p-type high impurity concentration planar region 5 overlays the n-type well region 9 in the memory cell array area 101.

Figure 13B:
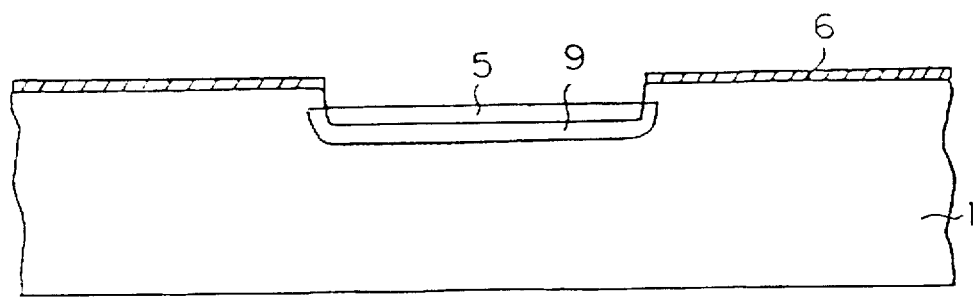

With reference to FIG. 13B, an etching process for the silicon oxide film 6 and a surface region of the p-type high impurity concentration planar region 5 is accomplished by using the photo-resist pattern 3 as a mask member. As a result of the etching process, the silicon oxide film 6 is removed except for a portion underlying the photo-resist pattern 3, and thus a portion of the silicon oxide film 6 in the memory cell array area 101 is removed thereby the surface of the high impurity concentration planar region 5 is exposed. Subsequently, the exposed surface of the high impurity concentration region 5 is subjected to the etching thereby a recessed portion is formed in the surface of the high impurity concentration planar region 5. After that, the photo-resist pattern 3 which has finished serving as the mask member overlying the remaining silicon oxide film 6 is removed.

Figure 13C:
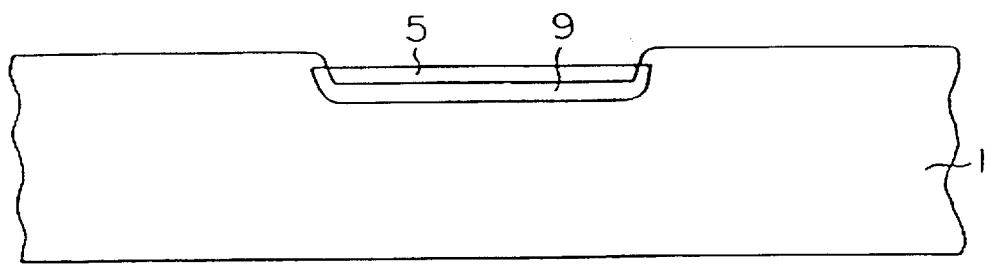

With reference to FIG. 13C, the remaining silicon oxide film 6 is removed, thereby the surface of the silicon substrate is exposed but in the peripheral circuit area 100.

Therefore, the silicon substrate 1 includes the high impurity planar region 5 at its surface in the memory cell array area 101 and the exposed surface of the substrate 1 having a lower impurity concentration than that of the high impurity concentration planar region 5. The high impurity concentration planar region 5 underlies the recessed portion formed in the memory cell array area 101.

Each of the novel substrate structures provided by the above embodiments according to the present invention has the surface which comprises the high impurity concentration planar region underlying the recessed portion in the memory cell array area 101 and the peripheral circuit area 100 having a lower impurity concentration than that of the high impurity concentration planar region. The existence of the recessed portion in the memory cell array area 101 is permissive of reducing the difference in levels of the surface of the semiconductor integrated circuit device. The reduction of the difference in levels of the surface of the semiconductor integrated circuit device enables the photo-lithography to accomplish fine patterns, thereby providing a high integration.

Further, the high impurity concentration planar region formed directly under the recessed portion in the memory cell array area 101 is separated from the peripheral region of the substrate 1. The impurity concentrations of the high impurity concentration planar region and the peripheral region of the substrate is so determined as to allow transistors formed in the memory cell array area 101 and transistors formed in the peripheral circuit area 100 to exhibit respectively best performance and most excellent characteristics.

Figure 14:
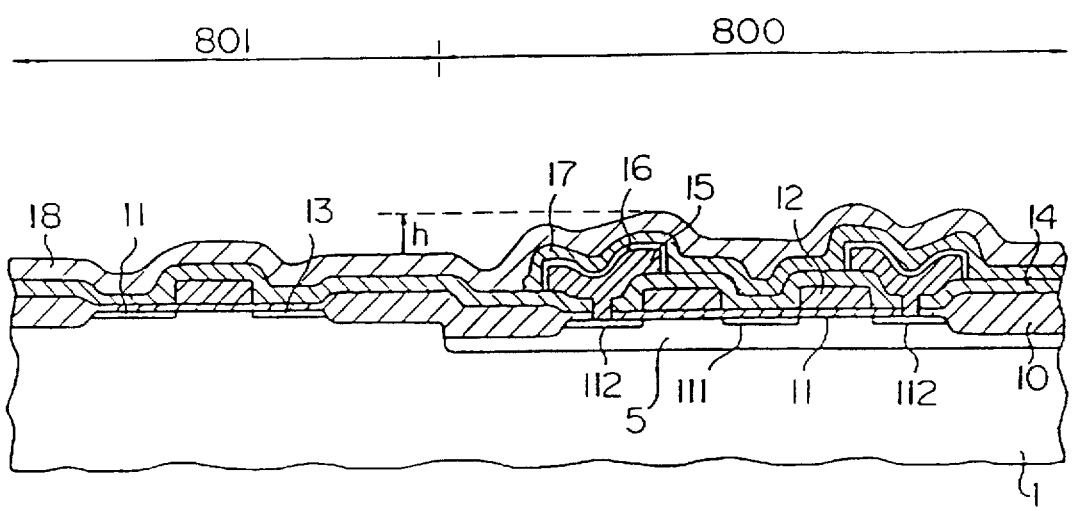
FIG. 14 is a fragmentary cross sectional elevation view illustrative of a novel structure of a dynamic random access memory cell device comprising a memory cell array area and a peripheral circuit area in which the memory device is formed on a novel semiconductor substrate of the present invention.

To clear advantages provided by the present invention, the structure of a dynamic random access memory cells (DRAM cells) formed on the novel substrate structure of the present invention will be described with reference to FIG. 14.

Figure 1:
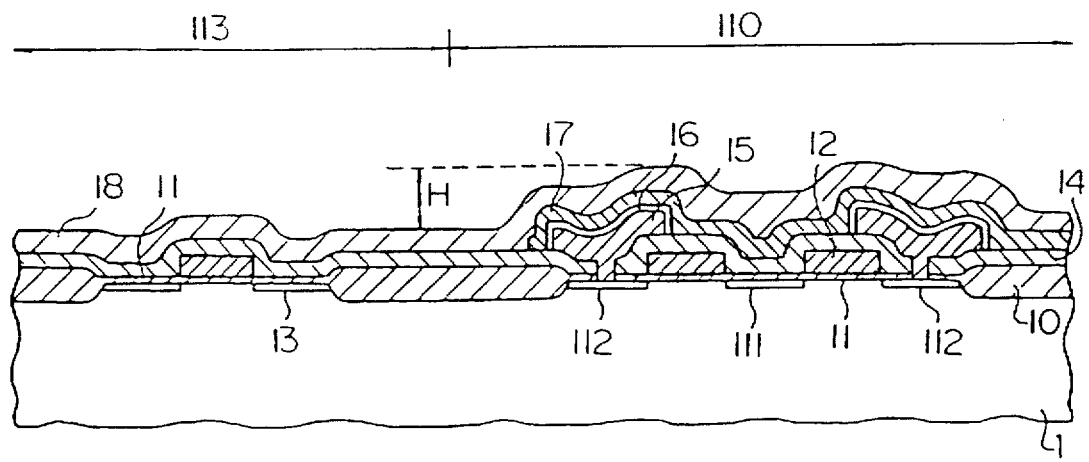
FIG. 1 is a fragmentary cross sectional elevation view illustrative of the conventional structure of the dynamic random access memory cell device comprising a memory cell array area and a peripheral circuit area.
Figure 2:
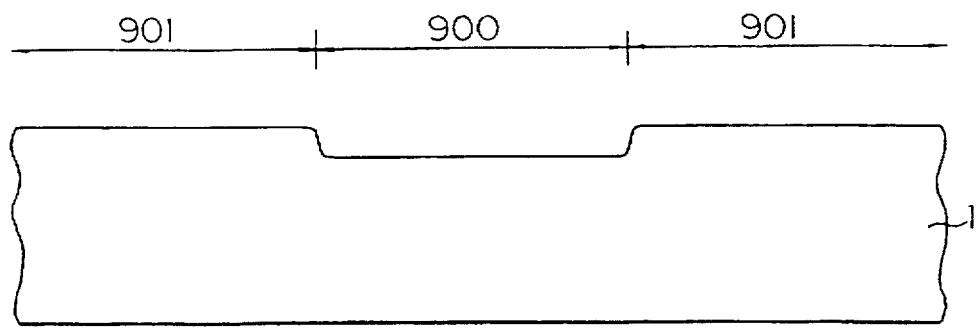
FIG. 2 is a fragmentary cross sectional elevation view illustrative of the conventional structure of a semiconductor substrate for a semiconductor memory device in which the substrate has a recessed portion in a memory cell array area.
Figure 3:
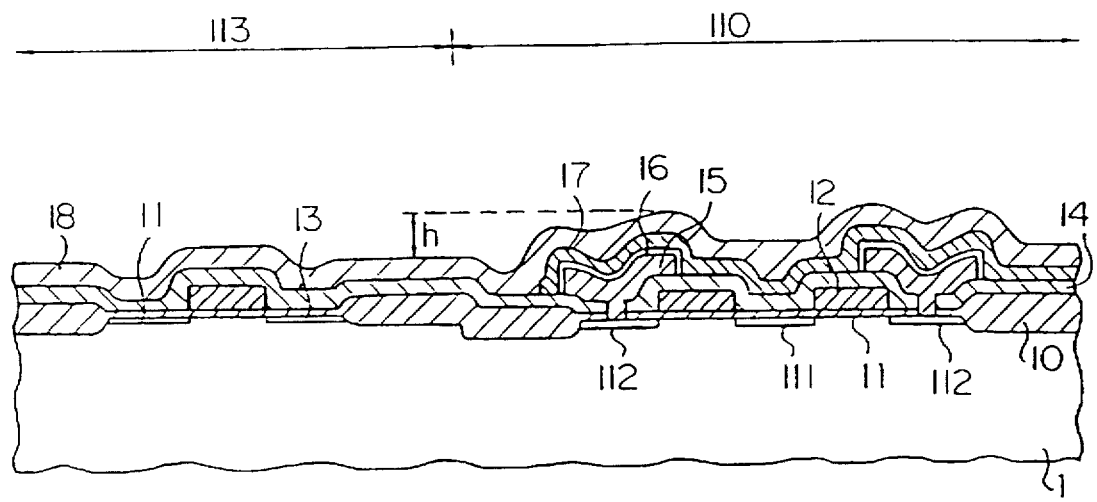
FIG. 3 is a fragmentary cross sectional elevation view illustrative of the conventional structure of the dynamic random access memory cell device comprising a memory cell array area and a peripheral circuit area in which the memory device is formed on a semiconductor substrate with a recessed portion in a memory cell array area.

The p-type silicon substrate 1 includes a recessed portion in the memory cell array area 800. Thus, the level of the surface in the memory cell array area 800 of the silicon substrate 1 is lower than that in the peripheral circuit area 801. The structure of the device illustrated in FIG. 14 is analogues to that of FIG. 3, except that a high impurity concentration planar region 5 is formed in the surface of the substrate 1 in the memory cell array area 800.

A $p^+$-type well region which is not illustrated is formed in the memory cell array area 800 of the p-type silicon substrate 1. Gate oxide films 11 are formed on the high impurity concentration planar region 5 in the memory cell array area 800 and on the p-type silicon substrate 1 in the peripheral circuit area 801. A field oxide film 10 is formed in the surface of the p-type silicon substrate 1 and in the surface of the high impurity concentration planar region 5 so as to separate the memory cell array area 800 from the peripheral circuit area 801. As the field oxide film 10 exists across the bounds between the memory cell array area 800 and the peripheral circuit area 801, the field oxide film 10 has a difference in level. Thus, a part of the field oxide film 10 overlays the surface of the high impurity concentration planar region 5 in the memory cell array area 800. Both the field oxide film 10 and the gate oxide film 11 are formed by using a selective oxidation such as local oxidation of silicon (LOCOS). Gate electrodes 12 are formed on the gate oxide films 11 in the both memory cell array area 800 and peripheral circuit area 801. An ion-implantation of an impurity of opposite conductive type to the silicon substrate 1, or the donor is carried out by using the self-alignment technique so that source and drain diffusion regions 111 and 112 are formed in the memory cell array area 800 and in the peripheral circuit area 801, thereby resulting in a self-aligned gate structure. The result is that field effect transistors are formed on the high impurity concentration planar region 5 in the memory cell array area 800 and on the surface of the substrate 1 in the peripheral circuit area 801. The transistor formed on the high impurity concentration planar region 5 in the memory cell array area 800 exists at a lower level than that formed on the surface of the substrate 1 in the peripheral circuit area 801. A silicon oxide film 14 is formed by using a chemical vapor deposition so as to cover an entire surface of the device, and thus to cover the gate electrodes 12. The silicon oxide film 14 will serve as an interlayer insulator. A bottom electrode 15 of a stacked capacitor is formed in the memory cell array area 800 so as to be electrically connected to the source region 112 of the transistor. A capacitive insulation film 16 is so formed as to cover the bottom electrode 15 of the stacked capacitor. A top electrode 17 of the stacked capacitor is formed on the capacitive insulation film 16 and the silicon oxide film 14 serving as the interlayer insulator, thereby resulting in a formation of a stacked capacitor in the memory cell array area 800. A silicate glass film such as a boro-phospho-silicate glass film 18 is so formed as to cover an entire surface of the device, followed by a heat treatment thereby resulting in a reflow of the boro-phospho-silicate glass film 18.

The transistors formed on the high impurity concentration region 5 in the memory cell array area 800 and on the surface of the substrate 1 in the peripheral circuit area 801 are respectively possessive of different performances, and thus properties from each other. The transistor characteristics, and thus performances depend upon the impurity concentrations at the both surfaces of the high impurity concentration planar region 5 and the silicon substrate 1. The impurity concentration of the silicon substrate 1 is required to be different from that of the high impurity concentration planar region 5. The both impurity concentrations of the high impurity concentration planar region 5 and the substrate 1 are respectively so determined that each of the transistors in the memory cell array area 800 and the peripheral circuit area 801 exhibits best performances and excellent properties. For example, the high impurity concentration planar region 5 in the memory cell array area 800 is required to have a higher impurity concentration than that of the substrate 1. Then, the novel substrate structure including the high impurity concentration planar region 5 is permissive of bringing out the best performance of each of the transistors in the memory cell array area 800 and in the peripheral circuit area 801.

In addition, as the silicon substrate 1 includes the recessed portion in the memory cell array area 800, the difference in levels of surfaces of the memory cell array area 800 and the peripheral circuit area 801 is reduced by the depth of the recessed portion in the silicon substrate 1. Thus, the surface of the memory device has a reduced irregularity. The surface of the boro-phospho-silicate glass film 18 in the memory cell array area 800 is higher than that in the peripheral circuit area 801, but it is inconsiderable. Thus, the recessed portion in the silicon substrate 1 enables the difference in levels of the surfaces of memory cell device to be substantially reduced so as to be inconsiderable for the photo-lithography technique.

The unremarkable difference in levels of both the memory cell array area 800 and the peripheral circuit area 801 is free from the difficulty in accomplishment of the fine pattern by the photo-lithography. Thus, such unremarkable irregularity in levels of the surface of the memory device makes a difference in depths of focus of the photo-lithography unremarkable. This makes it possible to implement the fine pattern and thus to promote the high integration. Therefore, the silicon substrate 1 including the recessed portion promotes the realization of the high integration of the memory device provided by the fine pattern of the photo-lithography.

Whereas modifications of the present invention will no doubt be apparent to a person of ordinary skilled in the art, it is to be understood that the embodiments shown and described by way of illustration are by no means intended to be considered in a limiting sense. Accordingly, it is to be intended by the claims to cover all modifications of the invention which fall within the sprit and scope of the invention.

What is claimed is:

1. A method of forming a semiconductor substrate having an array area and a peripheral area for a semiconductor integrated circuit device including a first multi-layer structure having a first thickness formed in said array area and a second multi-layer structure having a second thickness formed in said peripheral area, said method comprising the steps of:

forming an insulation film on said semiconductor substrate;

selectively forming a photo-resist film on said insulation film in said peripheral area;

selectively etching said insulation film by use of said photo-resist film as a mask in order to leave said insulation film in said peripheral area;

carrying out a selective ion-implantation by use of said photo-resist film as a mask to form in said array area an impurity doped region of a conductivity type opposite to a conductivity type of said semiconductor substrate;

etching from the surface of the structure resulting from said ion-implantation to remove said photo-resist film in said peripheral region and also to remove said insulation film and a surface part of said impurity doped region in said array region to leave the insulation film in said peripheral region; and removal of the remaining insulation film from said peripheral region.

* * * * *